(12) United States Patent
Lee et al.

(10) Patent No.: US 12,271,079 B2
(45) Date of Patent: Apr. 8, 2025

(54) CIRCUIT BOARD FOR LIGHT-EMITTING DIODE ASSEMBLY, BACKLIGHT UNIT INCLUDING THE SAME AND IMAGE DISPLAY DEVICE INCLUDING THE SAME

(71) Applicant: DONGWOO FINE-CHEM CO., LTD., Jeollabuk-do (KR)

(72) Inventors: Cheol Hun Lee, Gyeonggi-do (KR); Do Hyoung Kwon, Gyeonggi-do (KR); Sung Jin Noh, Gyeonggi-do (KR)

(73) Assignee: DONGWOO FINE-CHEM CO., LTD., Jeollabuk-do (KR)

( * ) Notice: Subject to any disclaimer, the term of this patent is extended or adjusted under 35 U.S.C. 154(b) by 142 days.

(21) Appl. No.: 17/883,864

(22) Filed: Aug. 9, 2022

(65) Prior Publication Data

US 2023/0038765 A1 Feb. 9, 2023

(30) Foreign Application Priority Data

Aug. 9, 2021 (KR) .................. 10-2021-0104330

(51) Int. Cl.
*G02F 1/1335* (2006.01)
*G02F 1/13357* (2006.01)
*H01L 25/075* (2006.01)
*H05K 1/11* (2006.01)

(52) U.S. Cl.
CPC .. *G02F 1/133612* (2021.01); *G02F 1/133601* (2021.01); *G02F 1/133603* (2013.01); *H01L 25/0753* (2013.01); *H05K 1/111* (2013.01)

(58) Field of Classification Search
CPC ......... G02F 1/133612; G02F 1/133601; G02F 1/133603; H01L 27/153; H01L 27/156; F21Y 2115/10
See application file for complete search history.

(56) References Cited

U.S. PATENT DOCUMENTS

2007/0242477 A1\* 10/2007 Yoo .......................... H05K 1/18
362/612
2014/0368769 A1\* 12/2014 Lee ................... G02F 1/133603
349/65
2018/0180249 A1 6/2018 Yamada et al.
2022/0351694 A1\* 11/2022 Kim ..................... G09G 3/3611

FOREIGN PATENT DOCUMENTS

| JP | 2015-156332 A | 8/2015 |
| KR | 10-1303188 B1 | 9/2013 |
| KR | 10-2020-0042057 A | 4/2020 |
| KR | 10-2021-0008246 A | 1/2021 |

OTHER PUBLICATIONS

Office action issued on Jan. 9, 2025 from Korean Patent Office in a counterpart Korean Patent Application No. 10-2021-0104330 (all the cited references are listed in this IDS.) (English translation is also submitted herewith.).

\* cited by examiner

*Primary Examiner* — Angela M. Medich
(74) *Attorney, Agent, or Firm* — The PL Law Group, PLLC

(57) ABSTRACT

A circuit board for a light-emitting diode assembly according to an embodiment includes a substrate layer, dimming zones formed on one surface of the substrate layer, each of the dimming zones comprising a predetermined number of LED landing pads, and a wiring bundle disposed between the dimming zones neighboring in a row direction to extend in a column direction, the wiring bundle including wirings connected to the LED landing pads at the same level.

14 Claims, 5 Drawing Sheets

CIRCUIT BOARD FOR LIGHT-EMITTING DIODE ASSEMBLY, BACKLIGHT UNIT INCLUDING THE SAME AND IMAGE DISPLAY DEVICE INCLUDING THE SAME

PRIORITY

This application claims the benefit under 35 USC § 119 of Korean Patent Application No. 10-2021-0104330 filed on Aug. 9, 2021 in the Korean Intellectual Property Office (KIPO), the entire disclosure of which is incorporated herein by reference for all purposes.

BACKGROUND

1. Field

The present invention relates to a circuit board for a light-emitting diode assembly, a backlight unit including the same and an image display device including the same. More particularly, the present invention relates to a circuit board for a light-emitting diode assembly including a substrate and a circuit wiring, a backlight unit including the same, and an image display device including the same.

2. Description of the Related Art

A cold cathode fluorescent lamp (CCFL) has been conventionally used as a backlight source of a liquid crystal display (LCD) device. However, the CCFL uses a mercury gas, and thus may cause environmental pollution and may be disadvantageous from aspects of a response speed and a color reproducibility. Further, the CCFL was disadvantageous in a fabrication of a thin LCD panel.

Accordingly, a light-emitting diode (LED) is being employed as the backlight source. The LED is an eco-friendly light source, and may provide a high-speed response and a color reproducibility with high-luminance. Additionally, luminance, color temperature, etc., may be adjusted by controlling a light-amount of red, green and blue LEDs, and the thin LCD panel with a compact size may be fabricated using the LED.

The LED light source may be mounted on a circuit board to define a backlight unit, and the backlight unit may be disposed under the LCD panel.

Landing pads on which a plurality of the LEDs are each mounted may be disposed on the circuit board, and wirings for a power supply to the landing pads and an operational control may be arranged.

As the large number of the landing pads are included in one circuit board, a uniform channel resistance may not be provided for each LED and an efficient circuit design may not be obtained due to a large circuit density. Further, as disclosed in Korean Registered Patent Publication No. 10-1303188, when wirings are disposed on both surfaces of a circuit board, additional via holes or contacts are required to cause a degradation of an electrical circuit connection reliability.

SUMMARY

According to an aspect of the present invention, there is provided a circuit board for a light-emitting diode assembly providing improved electrical property and luminant efficiency.

According to an aspect of the present invention, there is provided a backlight unit providing improved electrical property and luminant efficiency.

According to an aspect of the present invention, there is provided an image display device including the backlight unit.

(1) A circuit board for a light-emitting diode assembly, including: a substrate layer; dimming zones formed on one surface of the substrate layer, each of the dimming zones including a predetermined number of LED landing pads; and a wiring bundle disposed between the dimming zones neighboring in a row direction to extend in a column direction, the wiring bundle including wirings connected to the LED landing pads at the same level.

(2) The circuit board for a light-emitting diode assembly of the above (1), wherein a plurality of the dimming zones are arranged in the column direction to form a dimming zone column, and a plurality of the dimming zone columns are arranged in the row direction.

(3) The circuit board for a light-emitting diode assembly of the above (2), wherein the wiring bundle is disposed in a space between neighboring dimming zone columns of the plurality of the dimming zone columns.

(4) The circuit board for a light-emitting diode assembly of the above (1), wherein the wiring bundle includes: a common wiring commonly connected to a plurality of dimming zones among the dimming zones; and an individual wiring connected to each of the dimming zones.

(5) The circuit board for a light-emitting diode assembly of the above (4), wherein the wiring bundle includes a plurality of the individual wirings having different lengths, and as a length of the individual wiring increases, a maximum width of the individual wiring increases.

(6) The circuit board for a light-emitting diode assembly of the above (4), wherein the wiring bundle includes a plurality of the individual wirings, and at least one individual wiring of the plurality of the individual wirings has a gradually increasing line width.

(7) The circuit board for a light-emitting diode assembly of claim 6, wherein the at least one individual wiring of the plurality of the individual wirings includes an expanded portion, and a line width of the at least one individual wiring increases with the expanded portion interposed therebetween.

(8) The circuit board for a light-emitting diode assembly of the above (7), wherein the expanded portion is inclined with respect to an extension direction of the wiring bundle.

(9) The circuit board for a light-emitting diode assembly of the above (1), wherein LED landing pads disposed at a lateral side in the row direction of the dimming zones have a reduced area.

(10) The circuit board for a light-emitting diode assembly of the above (9), wherein each of the LED landing pads includes a first landing pad and a second landing pad having different polarities, and one of the first landing pad or the second landing pad included in each of the LED landing pads disposed at the lateral side has a reduced area.

(11) The circuit board for a light-emitting diode assembly of the above (1), further including an insulating layer formed on the substrate layer to cover the wiring bundle, the insulating layer including an opening partially exposing each of the LED landing pads.

(12) The circuit board for a light-emitting diode assembly of the above (11), wherein a double-layered structure consisting of a single-layered conductive circuit layer including the LED landing pads and the wiring bundle, and a single-layered insulating layer is stacked on the one surface of the substrate layer.

(13) The circuit board for a light-emitting diode assembly of the above (12), wherein the conductive circuit layer further includes connection pads, each of which is formed at each terminal end portion of the wirings.

(14) The circuit board for a light-emitting diode assembly of the above (12), further including an intermediate layer formed between the conductive circuit layer and the substrate layer.

(15) The circuit board for a light-emitting diode assembly of the above (14), wherein the intermediate layer includes a plating seed layer or an adhesive layer.

(16) The circuit board for a light-emitting diode assembly of the above (1), wherein the substrate layer includes a glass substrate, an organic polymer substrate or an inorganic insulating substrate.

(17) A backlight unit, including: the circuit board for a light-emitting diode assembly according to embodiments as described above; and light emitting diodes mounted on the circuit board for a light-emitting diode assembly.

(18) An image display device, including: the backlight unit according to embodiments as described above; and a liquid crystal panel disposed on the backlight unit.

According to exemplary embodiments, a common wiring and individual wirings may be disposed between adjacent dimming zone columns. Accordingly, a periodicity of an LED array may be achieved. Thus, an LED mounting efficiency and light-emitting properties may be improved, and spatial efficiency may be enhanced.

In some embodiments, maximum widths of the individual wirings may increase as a distance from one lateral side of the dimming zone increases. Thus, disconnection of the individual wirings may be prevented, and a resistance variation of the individual wirings may be suppressed.

In some embodiments, a landing pad disposed at a lateral the side of the dimming zone may have a reduced area. Accordingly, efficiency of a wiring arrangement space may be enhanced while maintaining the periodicity of the same LED array, and arrangement of the wirings and an electrical connection with the pad may be easily implemented.

In exemplary embodiments, the LED landing pads forming a dimming block or the dimming zone, the common wiring and the individual wiring may all be distributed at the same layer or at the same level on one surface of a substrate layer.

Accordingly, an increase of resistance due to a contact or via connection may be prevented, and improved electrical connection reliability may be achieved. Thus, desired high color reproducibility and high luminance may be effectively implemented from the dimming zone.

DETAILED DESCRIPTION OF THE EMBODIMENTS

According to exemplary embodiments of the present invention, a circuit board for a light-emitting diode assembly including light-emitting diode landing pads forming dimming zones and wirings connected to the dimming zones is provided. According to exemplary embodiments of the present invention, a backlight unit and an image display device including the circuit board for a light-emitting diode assembly are also provided.

In exemplary embodiments, the circuit board for the light-emitting diode assembly may be a glass-based circuit board for a mini-LED assembly.

Hereinafter, the present invention will be described in detail with reference to the accompanying drawings. However, those skilled in the art will appreciate that such embodiments described with reference to the accompanying drawings are provided to further understand the spirit of the present invention and do not limit subject matters to be protected as disclosed in the detailed description and appended claims.

Figure 1:
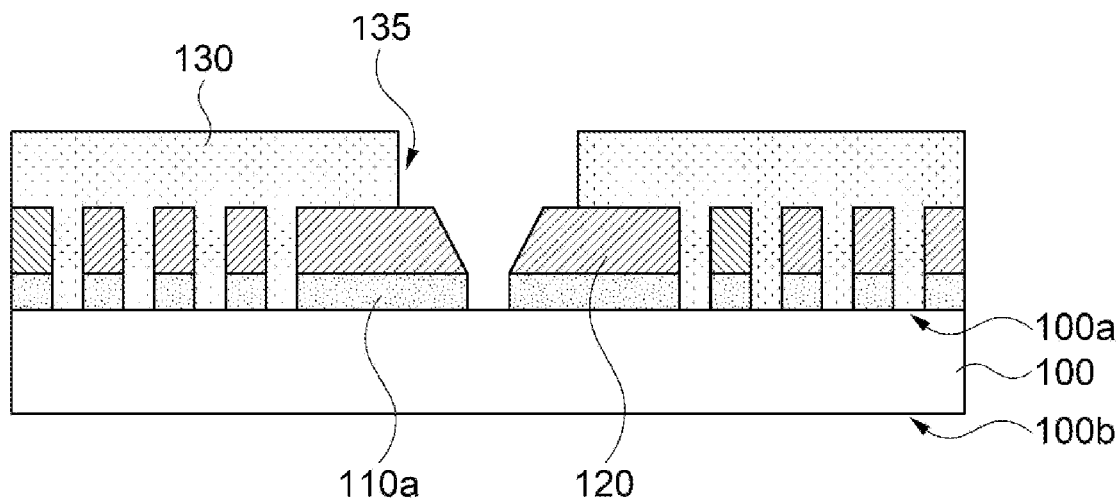
FIGS. 1 and 2 are schematic cross-sectional views illustrating a circuit board for a light-emitting diode assembly in accordance with exemplary embodiments.
Figure 2:
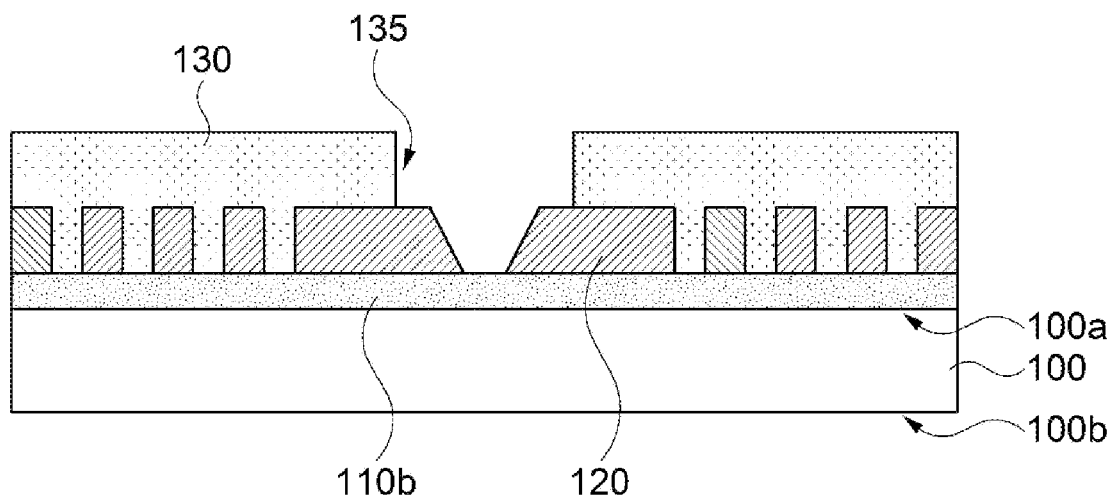

FIGS. 1 and 2 are schematic cross-sectional views illustrating a circuit board for a light-emitting diode assembly in accordance with exemplary embodiments.

Referring to FIGS. 1 and 2, a circuit board for a light-emitting diode assembly (hereinafter, may be abbreviated as a circuit board) may include a substrate layer 100 and a conductive circuit layer 120 formed on one surface of the substrate layer 100. An insulating layer 130 including an opening 135 provided as a landing hole may be formed on the substrate layer 100.

The substrate layer 100 may include an insulating material used as a base substrate or a core layer of a printed circuit board. For example, the substrate layer 100 may be an inorganic insulating substrate including a transparent inorganic material such as silicon oxide, silicon nitride, etc., or an organic substrate including a transparent polymer material such as polyimide, cyclic olefin polymer (COP), etc. Preferably, the substrate layer 100 may be a glass substrate.

The substrate layer 100 may include a first surface 100a and a second surface 100b. The first surface 100a and the second surface 100b may face each other. For example, the first surface 100a and the second surface 100b may correspond to a top surface and a bottom surface of the substrate layer 100, respectively.

The conductive circuit layer 120 may be formed on the first surface 100a of the substrate layer 100. In exemplary embodiments, the conductive circuit layer 120 may be formed only on the first surface 100a of the substrate layer 100, and may not be formed on the second surface 100b.

Accordingly, the circuit board according to the exemplary embodiments may be provided as a substantially single-sided circuit board.

In some embodiments, the conductive circuit layer 120 may be formed as a substantially single layer. For example, a multi-layered circuit structure through a via or a contact may be excluded.

The conductive circuit layer 120 may include a metal such as copper (Cu), nickel (Ni), palladium (Pd), chromium (Cr), etc.

An intermediate layer 110a and 110b may be formed between the conductive circuit layer 120 and the first surface 100a of the substrate layer 100.

As illustrated in FIG. 1, in some embodiments, the intermediate layer 110a may be a plating seed layer. In this case, the conductive circuit layer 120 may be a plated layer formed using the intermediate layer 110a as a seed.

For example, the intermediate layer 110a may include a metal such as titanium (Ti), copper (Cu), chromium (Cr), palladium (Pd), etc. The intermediate layer 110a may be formed by, e.g., an electroless plating or a deposition process.

In an embodiment, the intermediate layer 110a may include a copper seed layer, and the conductive circuit layer 120 may be a copper layer formed by an electrolytic plating using the copper seed layer.

The intermediate layer 110a and the conductive circuit layer 120 may be patterned substantially together to form circuit patterns.

As illustrated in FIG. 2, in some embodiments, the intermediate layer 110b may be an adhesive layer. In this case, the conductive circuit layer 120 may be formed from a metal foil, e.g., a copper foil. For example, the intermediate layer 110b and the conductive circuit layer 120 may be formed from a single-sided copper clad laminate (CCL) including the substrate layer 100. The intermediate layer 110b may be formed entirely on the first surface 100a of the substrate layer 100, and may be exposed between patterns of the conductive circuit layer 120.

In some embodiments, the intermediate layer 110a and 110b may be in direct contact with the first surface 100a of the substrate layer 100. The conductive circuit layer 120 may be in direct contact with the intermediate layer 110a and 110b.

The insulating layer 130 partially covering the conductive circuit layer 120 may be formed on the first surface 100a of the substrate layer 100. In exemplary embodiments, the insulating layer 130 may serve as a solder resist (SR) layer for mounting a light-emitting diode (LED).

In some embodiments, the insulating layer 130 may be formed of a highly reflective material having a light reflectance of 80% or more. For example, the insulating layer 130 may have a reflectance of 80% or more with respect to a visible light.

In an embodiment, the insulating layer 130 may have a reflectance of 80% or more with respect to a D65 light source among CIE standard light sources.

Accordingly, an LED light reflected from an upper portion of the backlight unit including the circuit board and re-incident to the circuit board may be reflected again. Thus, light efficiency in the backlight unit and the image display device may be improved.

Figure 3:
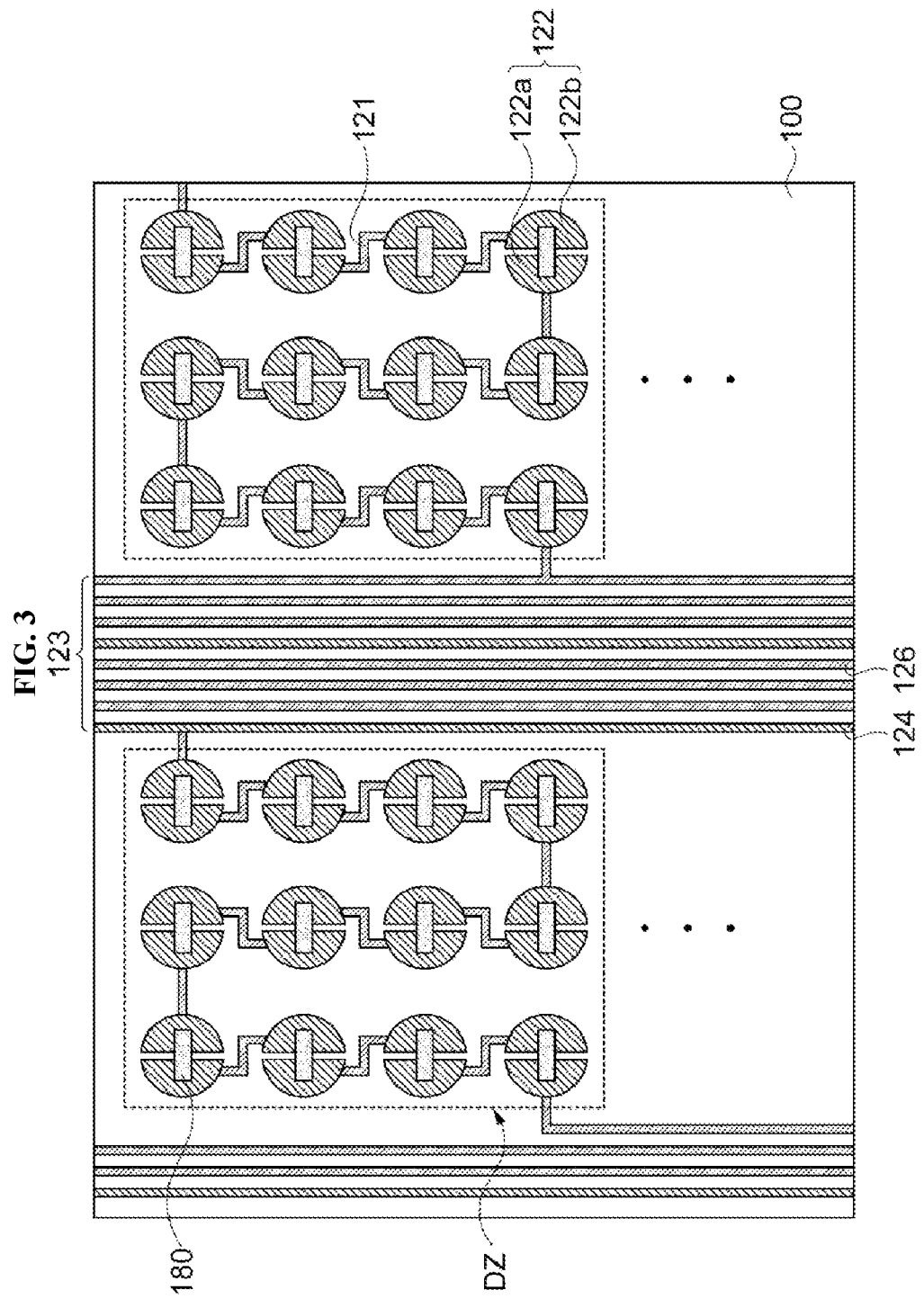
FIG. 3 is a schematic plan view illustrating a circuit board for a light-emitting diode assembly in accordance with exemplary embodiments.

The insulating layer 130 may include the opening 135 exposing the LED landing pad 122 (see FIG. 3). The LEDs may each be individually coupled or mounted on the LED landing pad 122 through the opening 135.

FIG. 3 is a schematic plan view illustrating a circuit board for a light-emitting diode assembly in accordance with exemplary embodiments.

Referring to FIG. 3, the conductive circuit layer 120 may include the LED landing pad 122, a common wiring 124 and an individual wiring 126. The conductive circuit layer 120 may further include a connection wiring 121 connecting the adjacent LED landing pads 122 to each other.

The LED landing pad 122 may include a first landing pad 122a and a second landing pad 122b having different polarities. For example, the first and second landing pads 122a and 122b may have a semicircular shape, and linear side surfaces of the first and second landing pads 122a and 122b may face each other.

Each of light-emitting diodes 180 may be mounted on the LED landing pad 122. The light-emitting diode 180 may be connected to and extend across the first and second landing pads 122a and 122b having different polarities.

As described with reference to FIGS. 1 and 2, the first and second landing pads 122a and 122b of the LED landing pad 122 may be partially exposed through the opening 135 of the insulating layer 130. Accordingly, the light-emitting diode 180 may be mounted on the circuit board through the opening 135.

The insulating layer 130 may entirely cover the common wiring 124, the individual wiring 126 and the connection wiring 121.

A predetermined number of the LED landing pads 122 may be connected by the connection wiring 121 to form a dimming zone DZ. The dimming zone DZ may serve as a light-emitting unit in a light-emitting diode assembly. For example, brightness and color of each of the dimming zones DZ may be individually controlled.

The number of the LED landing pads 122 included in one dimming zone DZ may be appropriately changed in consideration of a size of an image display device, a degree of integration of the light-emitting diodes, etc. For example, FIG. 3 illustrates that 12 LED landing pads 122 are included in one dimming zone DZ for convenience of descriptions. However, the number of LED landing pads 122 included in the dimming zone DZ may be further increased (e.g., 24, 36, 48, 72, etc.).

A plurality of the dimming zones DZ may be arranged on the first surface 100a of the substrate layer 100. The dimming zones DZ may be repeatedly disposed along a row direction and a column direction of the substrate layer 100 to form an assembly or an array.

In exemplary embodiments, wirings may be disposed between the dimming zones DZ adjacent in the row direction. As described above, the wirings may include the common wiring 124 and the individual wiring 126.

The common wiring 124 may be commonly connected to a predetermined number of dimming zones DZ among the dimming zones DZ. The individual wirings 126 may be independently connected to each of the dimming zones DZ.

For example, the common wiring 124 may be provided as a cathode wiring of the circuit board. The individual wiring 126 may be provided as an anode wiring of a circuit board.

In exemplary embodiments, a plurality of the dimming zones DZ may be arranged in the column direction to define a dimming zone column. A plurality of dimming zone columns may be arranged in the row direction. The wirings 124 and 126 may extend in the column direction between the dimming zone columns adjacent in the row direction.

As described above, the common wiring 124, the individual wiring 126 and the LED landing pads 122 may be included in the conductive circuit layer 120 together to form a single-layered circuit layer.

Accordingly, a channel resistance may be reduced compared to that of a circuit board having a multi-layered structure using a via or a contact. Further, the single-layered circuit layer may be used, so that all circuit patterns may be formed using a low-resistance copper foil or a low-resistance plating layer. Accordingly, the channel resistance may be further reduced.

Additionally, the wirings including the common wiring 124 and the individual wiring 126 may be disposed between the dimming zone columns, so that a regular or periodic arrangement and electrical connection of the LED or the LED landing pads 122 may be easily implemented. Thus, high luminous efficiency may be obtained and luminous properties may be controlled from the backlight unit including the circuit board with high reliability.

For example, a wiring bundle 123 including the common wiring 124 and the individual wiring 126 may be defined. A plurality of the wiring bundles 123 may be disposed in spaces between the dimming zone columns.

In an embodiment, one wiring bundle 123 may include a plurality of the individual wirings 126. In an embodiment, the wiring bundle 123 may include at least two or more common wirings 124. In an embodiment, the number of the individual wirings 126 included in one wiring bundle 123 may be greater than the number of common wirings 124. For example, as illustrated in FIG. 3, two common wiring 124 may be included in one wiring bundle 123.

Figure 4:
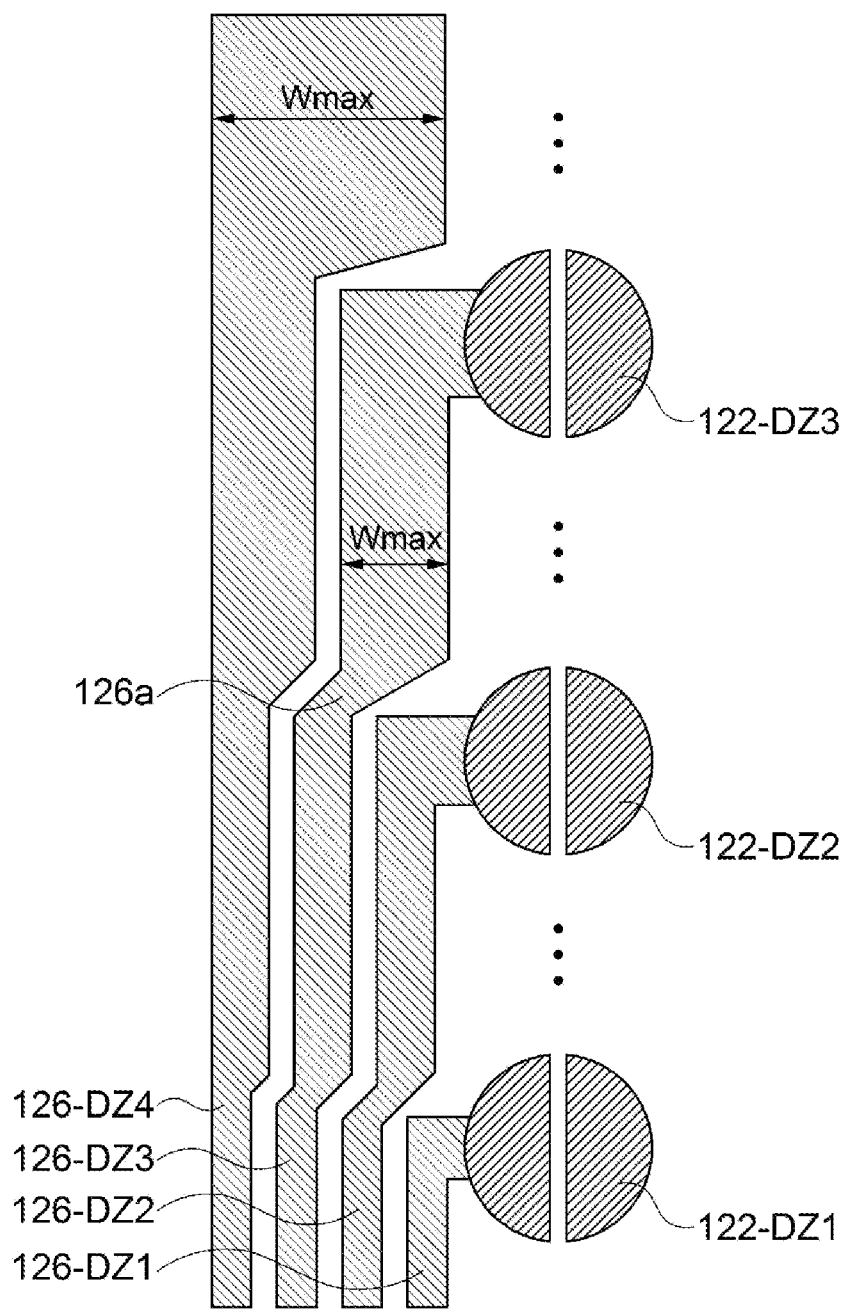
FIG. 4 is a schematic partially enlarged plan view illustrating a connection between a wiring and an LED landing pad in a circuit board for a light-emitting diode assembly in accordance with some exemplary embodiments.

FIG. 4 is a schematic partially enlarged plan view illustrating a connection between a wiring and an LED landing pad in a circuit board for a light-emitting diode assembly in accordance with some exemplary embodiments.

Referring to FIG. 4, the individual wirings 126 may be independently connected to one dimming zone DZ. As illustrated in FIG. 4, a first dimming zone DZ1 may include a first LED landing pad 122-DZ1 that is an LED landing pad connected to a first individual wiring 126-DZ1, and a second dimming zone DZ2 may include a second LED landing pad 122-DZ2 that is an LED landing pad connected to a second individual wiring 126-DZ2. A third dimming zone D3 may include a third LED landing pad 122-DZ3 that is an LED landing pad connected to a third individual wiring 126-DZ3. A fourth dimming zone DZ4 may include a fourth LED landing pad that is an LED landing pad connected to A fourth individual wiring 126-DZ4. For convenience of illustration, the fourth LED landing pad is omitted in FIG. 4.

Figure 6:
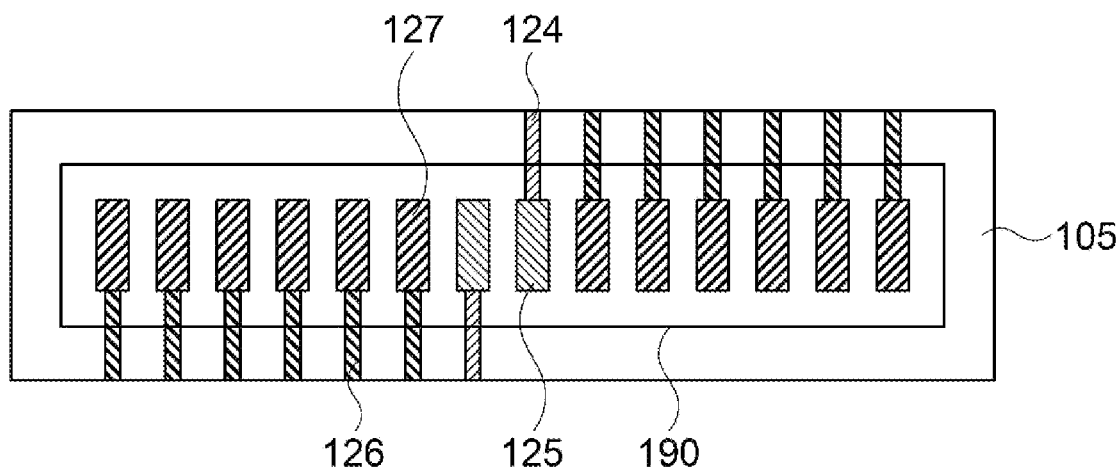
FIG. 6 is a schematic partially enlarged plan view illustrating connection pads included in a circuit board for a light-emitting diode assembly in accordance with exemplary embodiments.

The first to fourth dimming zones DZ1 to DZ4 may be sequentially disposed from an external connection region or a bonding region (see FIG. 6). For example, the first to fourth dimming zones DZ1 to DZ4 may be included in one dimming zone column. Accordingly, the first to fourth dimming zones DZ1 to DZ4 may be sequentially farther away from the external connection region.

In exemplary embodiments, maximum widths Wmax of the first to fourth individual wirings 126-DZ1 to 126-DZ4 may sequentially increase. Accordingly, an increase of the channel resistance to each dimming zone DZ as a distance from the external connection region increases may be suppressed or buffered.

As illustrated in FIG. 4, at least one of the individual wirings 126 may have a shape in which a line width may be gradually increased. For example, in FIG. 4, each of the second to fourth individual wires 126-DZ2 to 126-DZ4 may have a shape in which the line width may be gradually increased.

In some embodiments, the individual wiring 126 may include an expanded portion 126a. The line width of the individual wiring 126 may be sequentially increased by the expanded portion 126a. For example, the line width of the individual wiring 126 may be increased with the expanded portion 126a interposed therebetween.

The expanded portion 126a may be inclined by a predetermined angle (e.g., 45°) with respect to an extension direction (e.g., the column direction) of the individual wirings 126. Accordingly, the individual wiring 126 may extend into an empty space, so that the line width may be gradually increased.

As described above, the line width may be gradually increased as a length of the individual wiring 126 increases, so that an overall channel resistance of the dimming zones DZ may become uniform, and a voltage drop occurring in a specific dimming zone DZ may be prevented.

Figure 5:
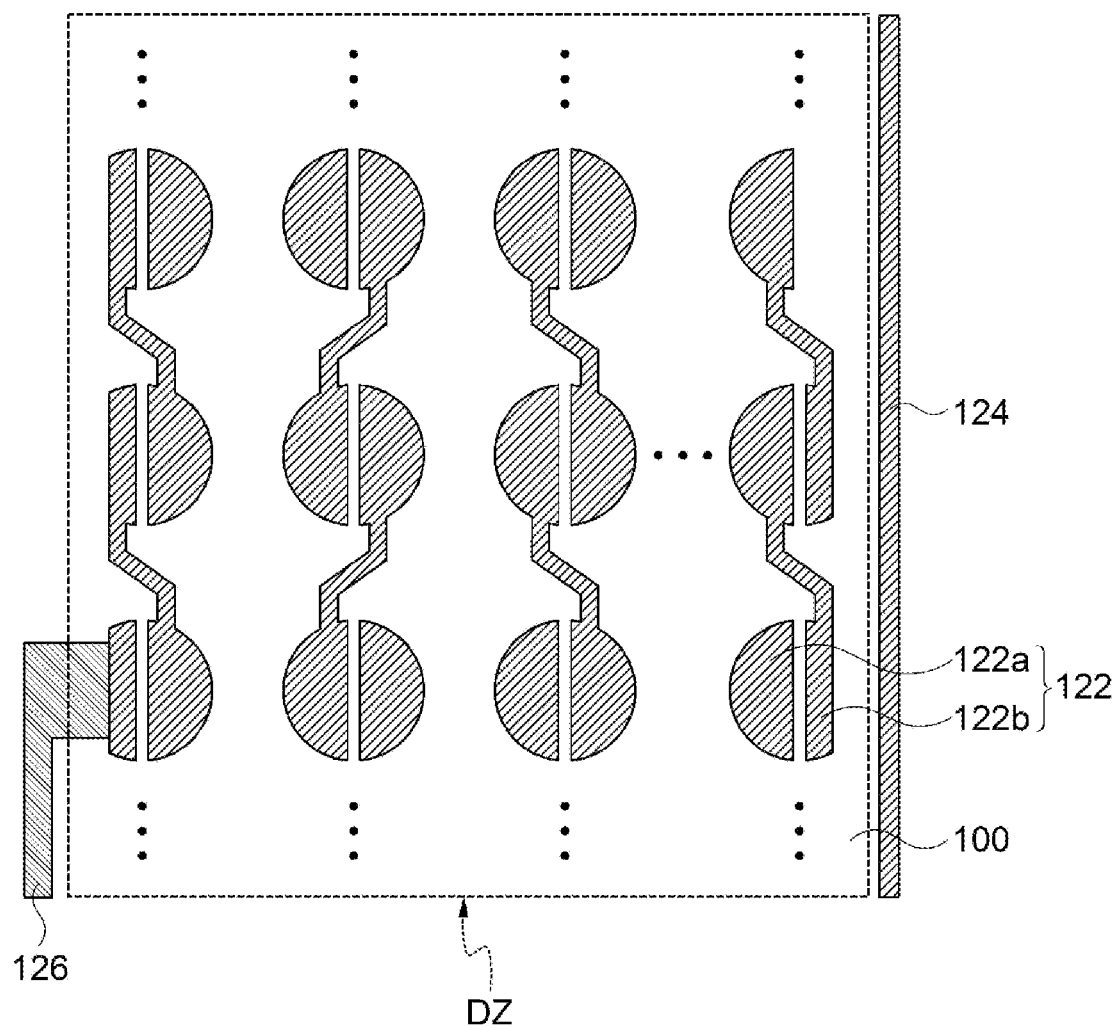
FIG. 5 is a schematic partially enlarged plan view illustrating a circuit board for a light-emitting diode assembly in accordance with some exemplary embodiments.

FIG. 5 is a schematic partially enlarged plan view illustrating a circuit board for a light-emitting diode assembly in accordance with some exemplary embodiments.

Referring to FIG. 5, the LED landing pads 122 disposed at a lateral side in the row direction of the dimming zone DZ among the LED landing pads 122 included in the dimming zone DZ may have a reduced area. For example, any one of the first landing pad 122a or the second landing pad 122b included in the LED landing pads 122 disposed at the lateral side may have a partially cut shape.

In some embodiments, as illustrated in FIG. 5, the LED landing pads 122 disposed at both lateral sides in the row direction of the dimming zone DZ may have a reduced area.

The area of the LED landing pad 122 may be reduced at the lateral side, so that an arrangement space for the wiring bundle 123 between the neighboring dimming zones DZ may be additionally obtained.

Accordingly, the width of each wiring or expanded portion 126a may also be increased, and the channel resistance to the dimming zone DZ may also be further reduced.

FIG. 6 is a schematic partially enlarged plan view illustrating connection pads included in a circuit board for a light-emitting diode assembly in accordance with exemplary embodiments.

Referring to FIG. 6, one end portion of the substrate layer 100 may serve as an external connection region 105. For example, terminal end portions of the above-described wirings 124 and 126 may be assembled in the external connection region 105.

Connection pads may be connected to the terminal end portions of the wirings 124 and 126. A common connection pad 125 may be connected to a terminal end portion of the common wiring 124, and an individual connection pad 127 may be connected to a terminal end portion of the individual wiring 126. In an embodiment, the terminal end portions of the wirings 124 and 126 may serve as the connection pads 125 and 127.

An external circuit structure 190 may be electrically connected to the conductive circuit layer 120 through the external connection region 105. For example, the external circuit structure 190 may include a driving integrated circuit chip or an external power supply. The external connection region 105 may be provided as a bonding region for electrically connecting the external circuit structure 190 to the LED landing pads 122.

In an embodiment, the external circuit structure 190 may further include an intermediate circuit structure such as a flexible circuit board and a connector for connecting the circuit board and the driving integrated circuit.

The external circuit structure 190 may supply a common signal and an individual signal to the dimming zone DZ through the wirings 124 and 126 via the connection pads 125 and 127.

According to the above-described exemplary embodiments, all wirings or conductive patterns included in the circuit board may be arranged on the first surface 100a of the substrate layer 100, and may substantially form a single-layered circuit.

For example, the above-described LED landing pads 122, the common wiring 124, the individual wiring 126 and connection pads 125 and 127 may all be disposed at the same layer or at the same level.

Figure 7:
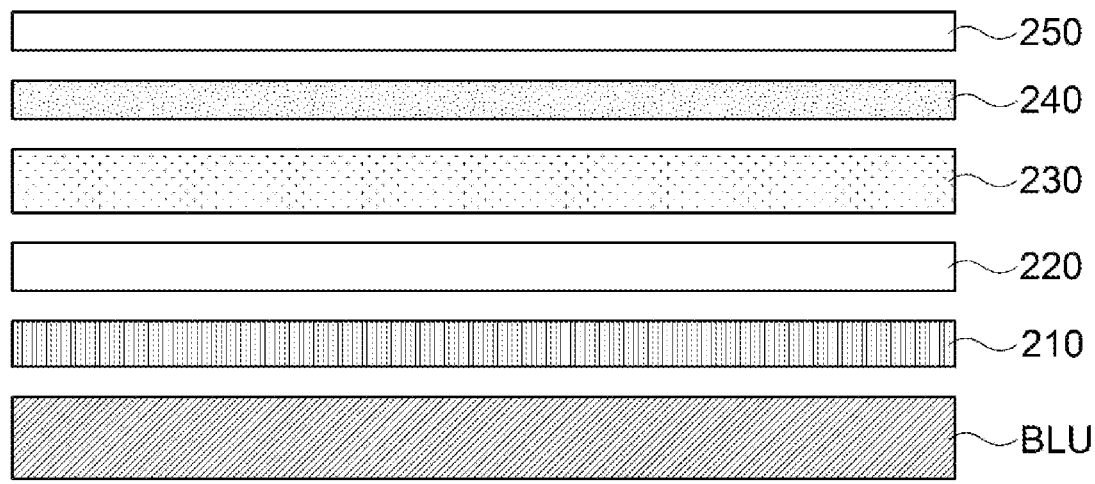
FIG. 7 is a schematic view illustrating a backlight unit and an image display device in accordance with exemplary embodiments.

FIG. 7 is a schematic view illustrating a backlight unit and an image display device in accordance with exemplary embodiments.

Referring to FIG. 7, as illustrated in FIG. 3, the light-emitting diodes 180 may be combined with the circuit board to define a backlight unit BLU. The backlight unit may be provided as a mini-LED BLU. In an embodiment, the backlight unit BLU may further include an optical film such as a light-guide plate or a diffusion plate.

The backlight unit BLU may be disposed under a TFT array substrate 220. A lower polarizing plate 210 may be disposed between the TFT array substrate 220 and the backlight unit BLU.

A liquid crystal cell 230 may be disposed on the TFT array substrate 220, and an LCD device to which a mini LED BLU according to exemplary embodiments is applied may be provided. A liquid crystal panel may be defined by the TFT array substrate 220 and the liquid crystal cell 230.

A color filter 240 may be disposed on the liquid crystal cell 230, and a cover glass 250 may be disposed on the color filter 240. An upper polarizing plate may be further disposed between the color filter 240 and the cover glass 250.

What is claimed is:

1. A circuit board for a light-emitting diode assembly, the circuit board comprising:
    a substrate layer;
    dimming zones formed on one surface of the substrate layer, each of the dimming zones comprising a predetermined number of LED landing pads;
    a wiring bundle disposed between the dimming zones neighboring in a row direction to extend in a column direction, the wiring bundle comprising wirings connected to the LED landing pads at the same level; and
    an insulating layer formed on the substrate layer to cover the wiring bundle, the insulating layer including an opening partially exposing each of the LED landing pads,
    wherein a plurality of dimming zones neighboring in the column direction of the dimming zones to form a dimming zone column, and a plurality of the dimming zone columns are arranged in the row direction,
    wherein the wiring bundle comprise at least two common wirings commonly connected to a plurality of dimming zones among the dimming zones; and
    an individual wiring connected to each of the dimming zones,
    wherein a double-layered structure consisting of a single-layered conductive circuit layer including the LED landing pads and the wiring bundle, and a single-layered insulating layer is stacked on the one surface of the substrate layer,
    wherein the circuit board further comprises an intermediate layer formed between the conductive circuit layer and the substrate layer.

2. The circuit board of claim 1, wherein the wiring bundle is disposed in a space between neighboring dimming zone columns of the plurality of the dimming zone columns.

3. The circuit board of claim 1, wherein the wiring bundle comprises a plurality of the individual wirings having different lengths, and
    as a length of the individual wiring increases, a maximum width of the individual wiring increases.

4. The circuit board of claim 1, wherein the wiring bundle includes a plurality of the individual wirings, and
    at least one individual wiring of the plurality of the individual wirings has a gradually increasing line width.

5. The circuit board of claim 4, wherein the at least one individual wiring of the plurality of the individual wirings includes an expanded portion, and a line width of the at least one individual wiring increases with the expanded portion interposed therebetween.

6. The circuit board of claim 5, wherein the expanded portion is inclined with respect to an extension direction of the wiring bundle.

7. The circuit board of claim 1, wherein LED landing pads disposed at a lateral side in the row direction of the dimming zones have an area smaller than an area of LED landing pads which is not disposed at the lateral side.

8. The circuit board of claim 7, wherein each of the LED landing pads comprises a first landing pad and a second landing pad having different polarities, and
    one of the first landing pad or the second landing pad included in each of the LED landing pads disposed at the lateral side has a reduced area.

9. The circuit board of claim 1, wherein the single-layered conductive circuit layer further comprises connection pads, each of which is formed at each terminal end portion of the wirings.

10. The circuit board of claim 1, wherein the intermediate layer comprises a plating seed layer or an adhesive layer.

11. The circuit board of claim 1, wherein the substrate layer comprises a glass substrate, an organic polymer substrate or an inorganic insulating substrate.

12. A backlight unit, comprising:
    the circuit board of claim 1; and
    light emitting diodes mounted on the circuit board for a light-emitting diode assembly.

13. An image display device, comprising:
    the backlight unit of claim 12; and
    a liquid crystal panel disposed on the backlight unit.

14. A circuit board for a light-emitting diode assembly, the circuit board comprising:
    a substrate layer;
    dimming zones formed on one surface of the substrate layer, each of the dimming zones comprising a predetermined number of LED landing pads; and
    a wiring bundle disposed between the dimming zones neighboring in a row direction to extend in a column direction, the wiring bundle comprising wirings connected to the LED landing pads at the same level,
    wherein a plurality of dimming zones neighboring in the column direction of the dimming zones to form a dimming zone column, and a plurality of the dimming zone columns are arranged in the row direction,
    wherein the wiring bundle comprise at least two common wirings commonly connected to a plurality of dimming zones among the dimming zones; and
    an individual wiring connected to each of the dimming zones,
    wherein LED landing pads disposed at a lateral side in the row direction of the dimming zones have an area smaller than an area of LED landing pads which is not disposed at the lateral side.

\* \* \* \* \*